US00RE44551E

(19) United States
(12) Reissued Patent
Abdelgany et al.

(10) Patent Number: US RE44,551 E
(45) Date of Reissued Patent: Oct. 22, 2013

(54) UNIVERSAL TUNER FOR MOBILE TV

(71) Applicants: Mohy Abdelgany, Irvine, CA (US); Frank Carr, New Coast, CA (US); Hassan Elwan, Mission Viejo, CA (US); Amr Fahim, Newport Beach, CA (US); Edward Youssoufian, Irvine, CA (US)

(72) Inventors: Mohy Abdelgany, Irvine, CA (US); Frank Carr, New Coast, CA (US); Hassan Elwan, Mission Viejo, CA (US); Amr Fahim, Newport Beach, CA (US); Edward Youssoufian, Irvine, CA (US)

(73) Assignee: Newport Media, Inc., Lake Forest, CA (US)

(21) Appl. No.: 13/645,471

(22) Filed: Oct. 4, 2012

Related U.S. Patent Documents

Reissue of:
(64) Patent No.: 7,973,861
Issued: Jul. 5, 2011
Appl. No.: 11/737,222
Filed: Apr. 19, 2007

(51) Int. Cl.
*H04N 5/50* (2006.01)

(52) U.S. Cl.
USPC ..... 348/731

(58) Field of Classification Search
USPC ..... 348/731, 725, 726, 723, 552, 553; 375/347, 316; 455/91, 303, 307, 333, 455/213, 232.1
See application file for complete search history.

(56) References Cited

U.S. PATENT DOCUMENTS

| | | | | |
|---|---|---|---|---|
| 5,912,917 | A * | 6/1999 | Engelbrecht et al. | 375/131 |
| 6,346,850 | B2 * | 2/2002 | Essink | 327/552 |
| 6,560,448 | B1 * | 5/2003 | Baldwin et al. | 455/234.1 |
| 6,735,422 | B1 * | 5/2004 | Baldwin et al. | 455/232.1 |
| 7,038,733 | B2 * | 5/2006 | Dent | 348/614 |
| 7,286,027 | B2 * | 10/2007 | Tada et al. | 333/186 |
| 7,580,683 | B2 * | 8/2009 | Gardenfors et al. | 455/73 |
| 7,773,967 | B2 * | 8/2010 | Smith | 455/295 |
| 7,973,861 | B2 * | 7/2011 | Abdelgany et al. | 348/731 |
| 2004/0179628 | A1 * | 9/2004 | Haskin | 375/271 |
| 2006/0170828 | A1 * | 8/2006 | Muschallik et al. | 348/731 |

OTHER PUBLICATIONS

Ironi, A., "Mobile TV standards: One size doesn't fit all,"http://www.totaltele.com/View.aspx?ID=91546&t=4, Apr. 17, 2007.

* cited by examiner

*Primary Examiner* — Paulos M Natnael
(74) *Attorney, Agent, or Firm* — Rahman LLC

(57) ABSTRACT

A tuner for use in mobile television devices comprises at least one RF front end component comprising a LNA adapted to amplify mobile television signals; a PLL circuit to generate signals; and a pair of mixers to receive the signals from the LNA and the PLL circuit and downconvert the signals; an analog baseband component connected to the RF front end component, wherein the analog baseband component comprises I and Q channel signal paths each comprising a tunable high order impedance filter; at least one signal amplification stage; and a signal filter stage connected to the signal amplification stage, wherein the analog baseband component further comprises a plurality of switches operatively connected to the I and Q channel signal paths, and wherein the plurality of switches are selectively opened and closed in multiple configurations in order to allow the tuner to receive mobile TV signals for all mobile TV standards.

23 Claims, 6 Drawing Sheets

UNIVERSAL TUNER FOR MOBILE TV

Matter enclosed in heavy brackets [ ] appears in the original patent but forms no part of this reissue specification; matter printed in italics indicates the additions made by reissue.

*CROSS REFERENCE TO RELATED APPLICATION*

*This application is a reissue of U.S. Pat. No. 7,973,861, issued on Jul. 5, 2011, the contents of which in its entirety, is herein incorporated by reference.*

BACKGROUND

1. Technical Field

The embodiments herein generally relate to wireless communications, and, more particularly, to mobile television (TV) technologies.

2. Description of the Related Art

The field of wireless communications, and specifically mobile TV, is plagued with numerous standards that are supported in different parts of the world. This problem led to the requirement of having multi-mode mobile TV devices capable of supporting multiple standards. This is problematic due to the wide variation in specifications of each standard, especially data bandwidth. For high bandwidth standards, a direct conversion front-end receiver architecture is desired for several reasons. First, after mixing down the radio frequency (RF) signal, the baseband operates at the minimum operating frequency (minimizing bandwidth). Second, image rejection is completely eliminated, since there is no intermediate frequency (IF). For low data bandwidth standards, a low-IF heterodyne architecture is desired. A low-IF heterodyne architecture avoids low-frequency flicker noise produced by baseband analog circuitry by shifting the data signal to a frequency slightly away from DC.

One method to realize a multi-standard tuner is to use multiple receiver paths for each standard. While this method is relatively straightforward, it tends to suffer from a number of drawbacks including requiring a large chip/die-area, which translates to lower yield and higher cost; and a lamer die area also generally requires larger packages and hence a higher packaging cost as well as a larger printed circuit board (PCB) area. Accordingly, for multi-standard communication systems, there is a strong need for one receiver architecture that can accommodate both narrow bandwidth and high bandwidth standards.

SUMMARY

In view of the foregoing, an embodiment provides a tuner for use in mobile television devices, wherein the tuner comprises at least one RF front end component comprising a low noise amplifier (LNA) adapted to amplify mobile television signals; a phase-locked loop (PLL) circuit adapted to generate signals; and a pair of mixers adapted to receive the signals from the LNA and the PLL circuit and downconvert the received signals; an analog baseband component operatively connected to the RF front end component, wherein the analog baseband component comprises an I channel signal path and a Q channel signal path, and wherein each of the I and Q channel signal paths comprise a tunable high order impedance filter; at least one signal amplification stage; and a signal filter stage operatively connected to the at least one signal amplification stage, wherein the analog baseband component further comprises a plurality of switches operatively connected to the I and Q channel signal paths, and wherein the plurality of switches are selectively opened and closed in multiple configurations in order to allow the tuner to receive mobile TV signals for all mobile TV standards. The plurality of switches that are selectively opened cause circuit elements operatively connected to the opened switches and after the opened switches along the I and Q channel signal paths to refrain from consuming power.

The tuner may further comprise a polyphase filter operatively connected to the I and Q channel signal paths. The plurality of switches may comprise a switch configured between one of the at least one signal amplification stage of the I channel signal path and the polyphase filter. A switch may be configured prior to the polyphase filter along the I channel signal path. Additionally, a switch may be configured after to the polyphase filter along the I channel signal path. The plurality of switches may comprise a switch configured between one of the at least one signal amplifications stage of the Q channel signal path and the polyphase filter.

Also, the plurality of switches may comprise a switch configured between two signal amplifications stages along each of the I and Q channel signal paths. Moreover, the plurality of switches may comprise a switch configured between one of the at least one signal amplification stage and the signal filter stage along each of the I and Q channel signal paths. Additionally, the tunable high order impedance filter may comprise a complex tunable high order impedance filter.

Also, the plurality of switches may comprise a first switch configured between one of the at least one signal amplification stage of the I channel signal path and the polyphase filter, wherein the first switch is configured prior to the polyphase filter; a second switch configured between one of the at least one signal amplification stage of the Q channel signal path and the polyphase filter, wherein the second switch is configured prior to the polyphase filter; a third switch configured after the polyphase filter and prior to any of a second one of the at least one signal amplification stage of the I channel signal path and the signal filter stage of the I channel signal path; a fourth switch configured between the one of the at least one signal amplification stage along the I channel signal path and any of a second one of the at least one signal amplification stage of the I channel signal path and the signal filter stage of the I channel signal path; and a fifth switch configured between the one of the at least one signal amplification stage along the Q channel signal path and any of a second one of the at least one signal amplification stage of the I channel signal path and the signal filter stage of the Q channel signal path.

Preferably, when the first, second, third, fourth, and fifth switches are opened, the tuner is adapted to (i) receive Frequency Modulation (FM) radio signals, and (ii) receive mobile television signals for Digital Video Broadcast—Terrestrial (DVB-T), Digital Video Broadcast—Handheld (DVB-H), Terrestrial—Digital Multimedia Broadcast (T-DMB), Integrated Services Digital Broadcast—Terrestrial (ISDB-T); Media Forward Link Only (MediaFLO™), and Digital Audio Broadcast (DAB) wireless television standards, wherein the opened switches enable the tuner to operate in a direct conversion mode. Moreover, when the first, second, and third switches are opened and the fourth and fifth switches are closed, the tuner is preferably adapted to (i) receive FM radio signals, and (ii) receive mobile television signals for DVB-T, DVB-H, and Media Forward Link Only MediaFLO™ wireless television standards, wherein the opened switches enable the tuner to operate in a direct conversion mode.

Furthermore, wherein when the first, second, and third switches are closed and the fourth and fifth switches are opened, the tuner is preferably adapted to receive mobile television signals for Terrestrial—Digital Multimedia Broadcast (T-DMB), Integrated Services Digital Broadcast—Terrestrial (ISDB-T), and Digital Audio Broadcast (DAB) wireless television standards, wherein the opened switches enable the tuner to operate in a low-IF heterodyne mode. The tuner may further comprise at least one AC coupling capacitor configured along the I and Q channel signal paths.

Another embodiment provides a wireless receiver for use in mobile television devices, wherein the wireless receiver comprises at least one RF front end component comprising a LNA adapted to amplify mobile television signals; a PLL circuit adapted to generate signals; and a pair of mixers adapted to receive the signals from the LNA and the PLL circuit and downconvert the received signals. The receiver further comprises an analog baseband component operatively connected to the RF front end component, wherein the analog baseband component comprises an I channel signal path; a Q channel signal path; a polyphase filter operatively connected to the I and Q channel signal paths; and at least five switches operatively connected to the I and Q channel signal paths, wherein the at least five switches are selectively opened and closed in multiple configurations in order to allow the wireless receiver to receive mobile TV signals for all mobile TV standards, and wherein the at least five switches that are selectively opened cause circuit elements operatively connected to the opened switches and after the opened switches along the I and Q channel signal paths to refrain from consuming power.

Another embodiment provides a method of receiving a television signal in a mobile television device, wherein the method comprises downconverting an amplified mobile television signal in a wireless receiver; transmitting the converted signal along at least one of an I and Q channel signal path in the wireless receiver; filtering the converted signal along the I and Q channel signal paths; amplifying the converted signal along the I and Q channel signal path; and selectively diverting the converted signal along the I and Q channel signal path to selectively allow the receiver to receive FM radio signals and receive mobile television signals for each of DVB-T, DVB-H, T-DMB, ISDB-T; MediaFLO™, and DAB wireless television standards.

These and other aspects of the embodiments herein will be better appreciated and understood when considered in conjunction with the following description and the accompanying drawings. It should be understood, however, that the following descriptions, while indicating preferred embodiments anti numerous specific details thereof, are given by way of illustration and not of limitation. Many changes and modifications may be made within the scope of the embodiments herein without departing from the spirit thereof, and the embodiments herein include all such modifications.

BRIEF DESCRIPTION OF THE DRAWINGS

The embodiments herein will be better understood from the following detailed description with reference to the drawings, in which.

DETAILED DESCRIPTION OF PREFERRED EMBODIMENTS

Figure 1:
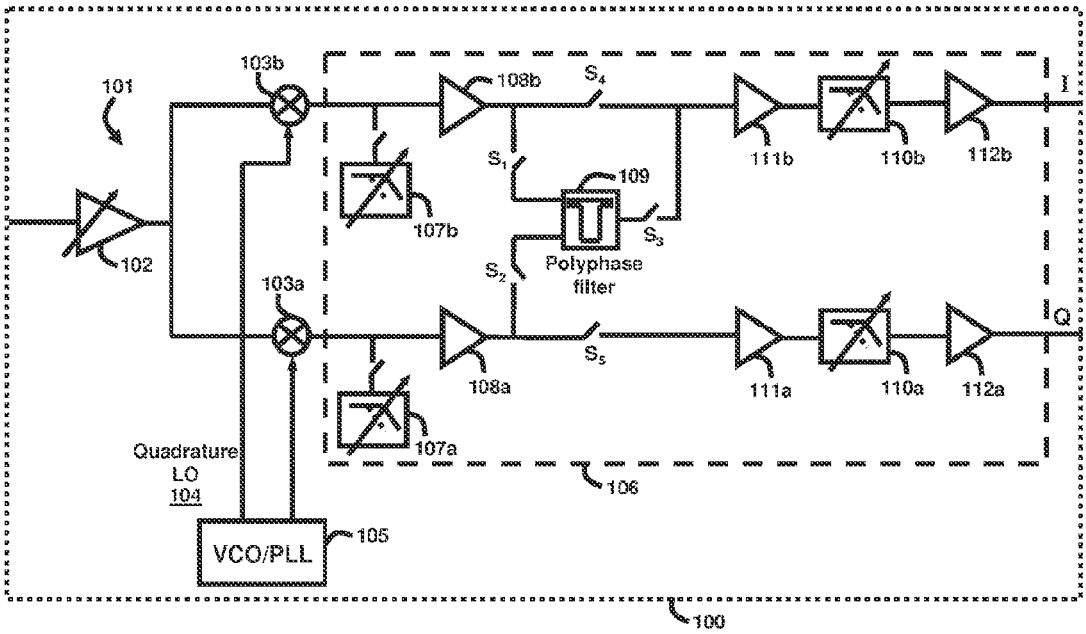
FIGS. 1 through 5 illustrate schematic circuit diagrams of a wireless tuner/receiver used in mobile TV devices utilizing various mobile TV standards according to the embodiments herein.

The embodiments herein and the various features and advantageous details thereof are explained more fully with reference to the non-limiting embodiments that are illustrated in the accompanying drawings and detailed in the following description. Descriptions of well-known components and processing techniques are omitted so as to not unnecessarily obscure the embodiments herein. The examples used herein are intended merely to facilitate an understanding of ways in which the embodiments herein may be practiced and to further enable those of skill in the art to practice the embodiments herein. Accordingly, the examples should not be construed as limiting the scope of the embodiments herein.

As mentioned, for multi-standard communication systems, there is a strong need for one receiver architecture that can accommodate both narrow bandwidth and high bandwidth standards. The embodiments herein achieve this by providing a new universal mobile-TV tuner integrated circuit. The architecture provided by the embodiments herein enables the tuner to receive mobile TV and audio signals in various bands and various standards. The architecture can be programmed into various configurations to suit various standards and allow optimal dynamic range and power trade-offs. Referring now to the drawings, and more particularly to FIGS. 1 through 6, where similar reference characters denote corresponding features consistently throughout the figures, there are shown preferred embodiments.

The embodiments herein provide a method and apparatus for a universal receiver or tuner that is suitable for multi-standard wireless systems, especially mobile TV and radio standards such as Digital Video Broadcast—Terrestrial (DVB-T), Digital Video Broadcast—Handheld (DVB-H), Terrestrial—Digital Multimedia Broadcast (T-DMB), Integrated Services Digital Broadcast—Terrestrial (ISDB-T), Media Forward Link Only (MediaFLO™), Digital Audio Broadcast (DAB), Advanced Television Systems Committee (ATSC), and Frequency Modulation (FM). The terms "tuner" and "receiver" are interchangeably used herein.

FIGS. 1 through 4 illustrate a tuner 100, which may be configured differently depending on which mobile TV or radio standard is desirable, whereby the changes in configurations are controlled by the opening/closing of a plurality of switches ($S_1$ through $S_5$) in the tuner 100. The tuner 100 comprises a RF front end 101 comprising a low noise amplifier (LNA) 102 with automatic gain control (AGC) and a pair of mixers 103a, 103b adapted to receive signals from a voltage controlled oscillator phase-locked loop (VCO/PLL) circuit 105. The local oscillator (LO) port 104 of the mixer 103b controls whether the receiver 100 is in direct conversion mode or low-IF heterodyne mode. In direct conversion mode, the LO frequency is set to be the same as the RF frequency. In low-IF heterodyne mode, the LO frequency is offset from the RF center frequency by a value equal to the desired IF frequency; in other words, IF=+/−(RF−LO). A direct conversion mode is more suitable for wider band signals and when the signal is surrounded by larger blockers (hence the image rejection requirement is very high for low-IF architectures). A low-IF mode is more suitable for lower bandwidth signals that has a smaller blocker profile (even in the adjacent channel) and hence the image rejection requirement is not stringent. One benefit of the low-IF mode is it avoids the problem of DC-Offset, can offer a better second-order intercept point (IIP2) performance and in some cases can save on power consumption (such as the ISDB-T mode (FIG. 4)).

Figure 2:
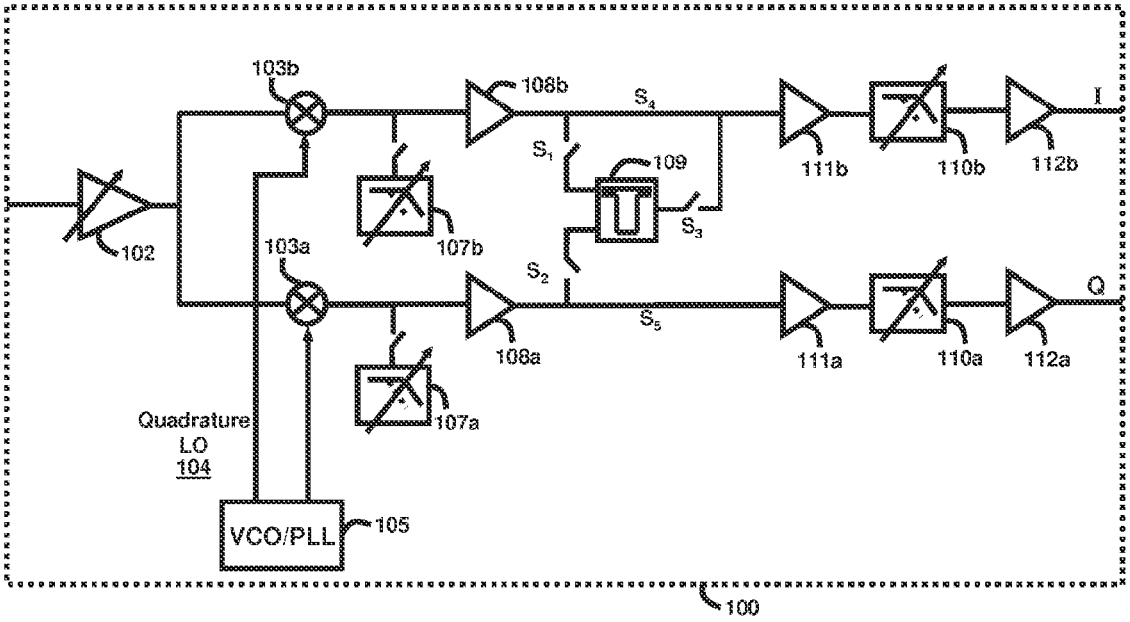
Figure 3:
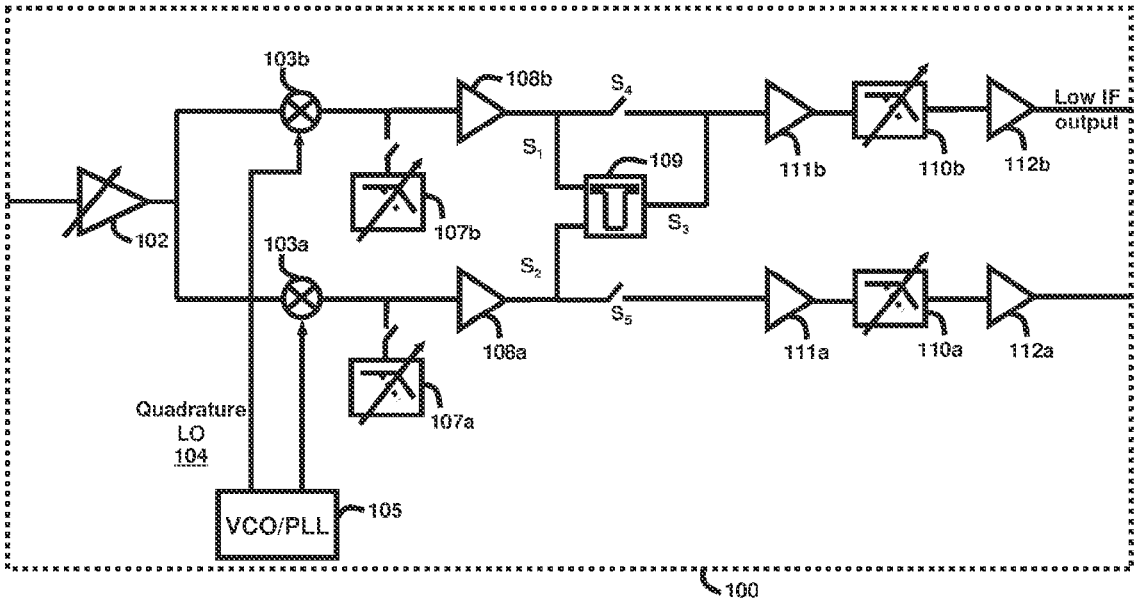

After downconversion through mixers 103a, 103b, the signal enters the universal analog baseband 106 portion of the receiver 100 whereby the signal is filtered and amplified by filters 107a, 107b and amplifiers 108a, 108b, respectively. Filters 107a, 107b are programmable (for generality) so in some modes with larger blockers the filter 107a, 107b switches are short and hence the filters 107a, 107b attenuate the blockers. For other modes if the blocker profile is not as aggressive, the filters 107a, 107b are switched off and powered down to save power. Moreover, the filters 107a, 107b may be embodied as tunable high order impedance filters 107a, 107b (FIGS. 1-3) or complex high order impedance filters 107a', 107b' (FIG, 4). The complex high order filter 107a', 107b' (FIG. 4) provides enhanced image rejection compared with filters 107a, 107b (FIGS. 1 through 3).

For the low-IF mode (FIG. 3), a polyphase filter 109 combines I and Q channels to form one low-IF channel. In the direct conversion mode (FIGS. 1, 2, and 4), the polyphase filter 109 is bypassed and the signal continues through the receiver 100 along the I and Q signal paths, respectively, where they are further processed by subsequent filtering 110a, 110b and amplification 111a, 111b, 112a, 112b stages. The polyphase filter 109 can be configured to provide high or low side injection, which may aid in reducing the infrared (IR) requirement when blockers are present. Preferably, filters 110a, 110b are tunable filters. The tunable filter frequency range is large, and is from 200 kHZ (FM) to 4 MHz (DVB-H). This large frequency rang is covered by combining band switching (coarse) with in-band (fine) tuning and comprises of smaller discrete frequency steps.

The embodiments herein support both low-IF and direct conversion receiver modes, which are suitable for narrow band and wide band standards, respectively. The selection can be performed through hardware and/or software configuration. Additionally, the first stage filter 107a, 107b attenuates out-of-band blockers and reduces the linearity requirements of subsequent stages 108a, 108b, 109, 110a, 110b, 111a, 111b, 112a, 112b). This filtering can be performed by a low-noise filter, for example. Alternatively, a low noise amplifier (not shown) can supersede the filter stage 107a, 107b to reduce the noise requirement of the filter 107. Moreover, amplifiers 108a, 108b, 111a, 111b, 112a, 112b can be placed in any order, individually removed, or configured as variable gain amplifiers. Furthermore, the receiver 100 provides a flexible trade-off between low-frequency noise and power consumption which allows the user to select receiver optimization for power consumption or performance. In this regard, in FIGS. 1 through 4, circuit elements that are not used (via open switches) are powered down thereby providing overall power consumption savings for the receiver 100. In the context of mobile TV, the receiver 100 can be used in direct conversion mode for DVB-T/H, Media-FLO, and DMB systems and used in low-IF mode for ISDB-T and FM.

FIG. 1 illustrates the tuner 100 being implemented in a direct conversion mode using the following wireless standards: DVB-H, DVB-T, ISDB-T, MedaFLO™, T-DMB, DAB, and FM. in this embodiment, switches $S_1$, $S_2$, $S_3$, $S_4$, and $S_5$ are all open switches, which effectively results in the circuit blocks included after the amplifiers 108a, 108b in the receiver 100 to be powered down with the Q and I signals being directly outputted from the amplifiers 108a, 108b, respectively. Moreover, in this embodiment the filters 107a, 107b are embodied as tunable high order impedance filters.

FIG. 2 illustrates the tuner 100 being implemented in a direct conversion mode using the following wireless standards: DVB-H, DVB-T, MediaFLO™, and FM. In this embodiment, switches $S_1$, $S_2$, and $S_3$ are all open switches while switches $S_4$ and $S_5$ are closed switches, which effectively results in the polyphase filter 109 being powered down with the Q and I signals being directly passed through the amplifier/filter/amplifier stage 111a, 110a, 112a and amplifier/filter/amplifier stage 111b, 110b, 112b, respectively. Moreover, in this embodiment the filters 107a, 107b are embodied as tunable high order impedance filters.

FIG. 3 illustrates the tuner 100 being implemented in a low-IF mode using the following wireless standards: ISDB-T, T-DMB, and DAB. In this embodiment, switches $S_1$, $S_2$, and $S_3$ are all closed switches while switches $S_4$ and $S_5$ are open switches, which effectively results in the signal coming from the amplifiers 108a, 108b to proceed through the polyphase filter 109 with the amplifier/filter/amplifier stage 111a, 110a, 112a being powered down and with the low IF output signal being directly passed through the amplifier/filter/amplifier stage 111b, 110b, 112b only. Moreover, in this embodiment the filters 107a, 107b are embodied as tunable high order impedance filters.

Figure 4:
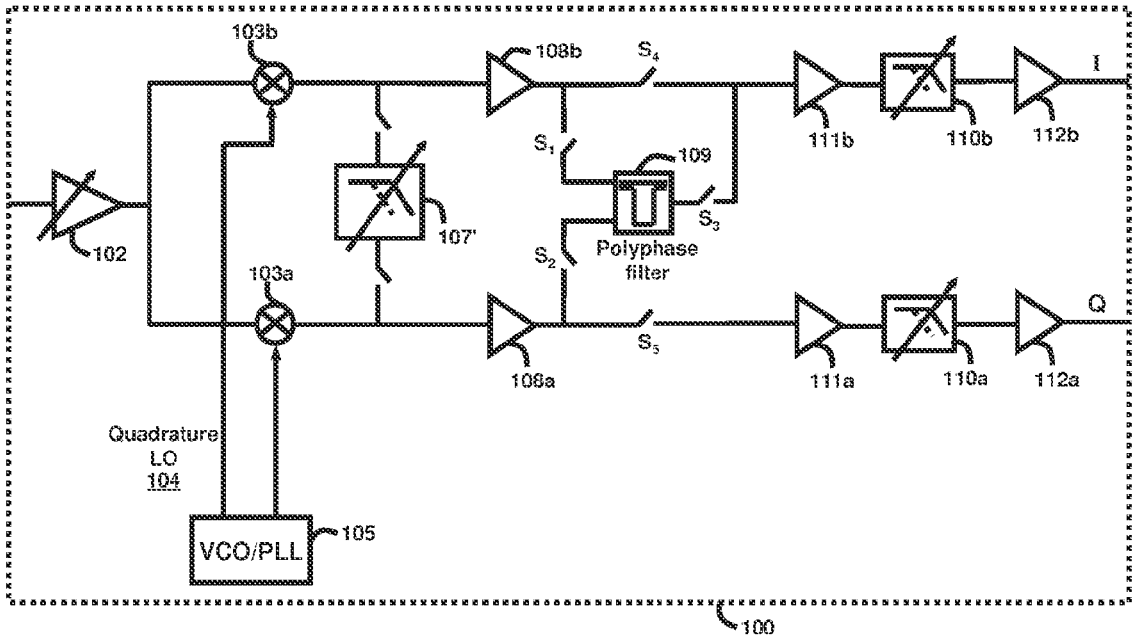

FIG. 4 illustrates the tuner 100 being implemented in a direct conversion mode using the following wireless standards: DVBV-H, DVB-T, ISDB-T, MediaFLO™, T-DMB, DAB, and FM. In this embodiment, switches $S_1$, $S_2$, $S_3$, $S_4$, and $S_5$ are all open switches, which effectively results in the polyphase filter 109 being powered down with the Q and I signals being directly passed through the amplifier/filter/amplifier stage 111a, 110a, 112a and amplifier/filter/amplifier stage 111b, 110b, 112b, respectively. Moreover, in this embodiment the filters (107a, 107b of FIGS. 1-3) are embodied as a complex tunable high order impedance filter 107'.

Figure 5:
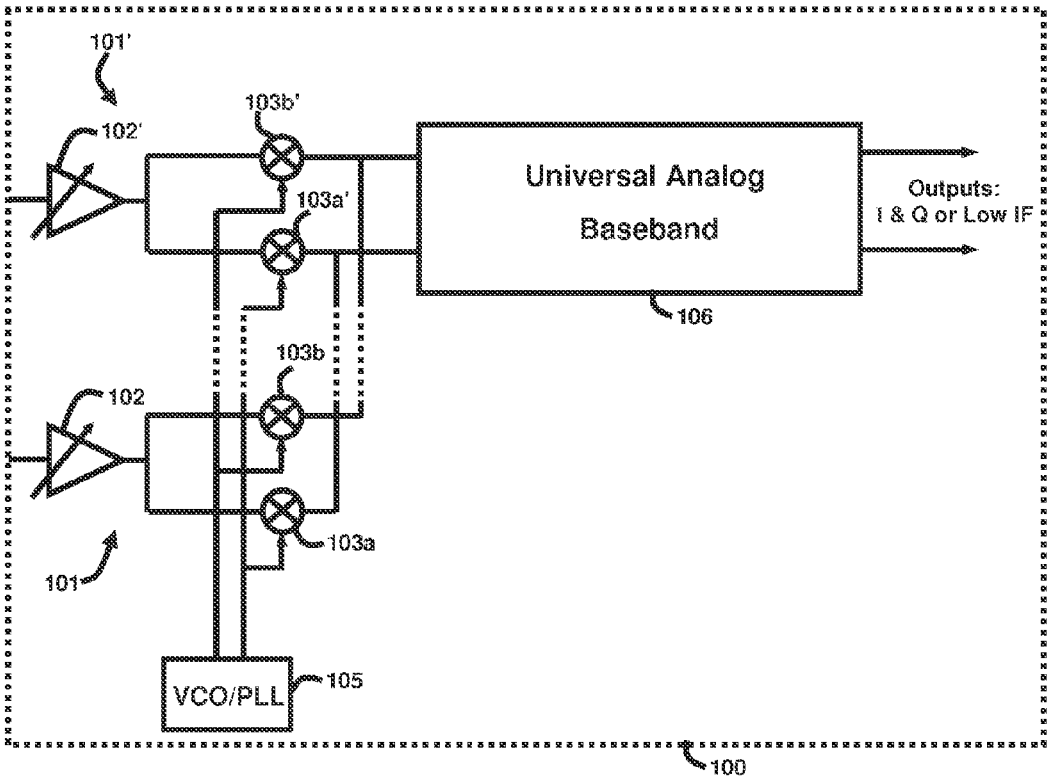

FIG. 5 illustrates the tuner 100 being implemented in either a low-IF mode or a direct conversion mode using the following wireless standards: DVB-H, DVB-T, ISDB-T, MediaFLO™, DMB-T, DAB, and FM. In this embodiment, multiple RF front ends 101, 101' are utilized, however signals are applied to only one baseband 106 and in operation only one LNA/mixer (either LNA/mixer 102/103a, 103b or LNA/mixer 102'/103a', 103b') is enabled at a time (as denoted by the dotted lines in FIG. 5 depicting that the signals are selectively sent from the VCO/PLL 105 to mixers 103a, 103b and mixers 103a', 103b'. The tuner architecture 100 shown in FIG. 5 allows the use of separate LNAs 102, 102' and mixers 103a, 103a', 103b, and 103b' for different RF bands. This makes the design of the front end 101, 101' more optimized for the frequency band it is handling. Furthermore, the frequency range needed by the VCO/PLL 105 is also reduced. For example, instead of covering the entire range of 200 MHz to 2 GHZ, a divide-by-two and a divide-by-four circuit can be used. Therefore, a 2 GHz signal can be divided by four to produce a 500 MHz signal. Therefore, the VCO/PLL 105 is never required to operate at 500 MHz (i.e., the VCO/PLL 105 can stay at 2 GHZ+/−delta for tuning).

Figure 6:
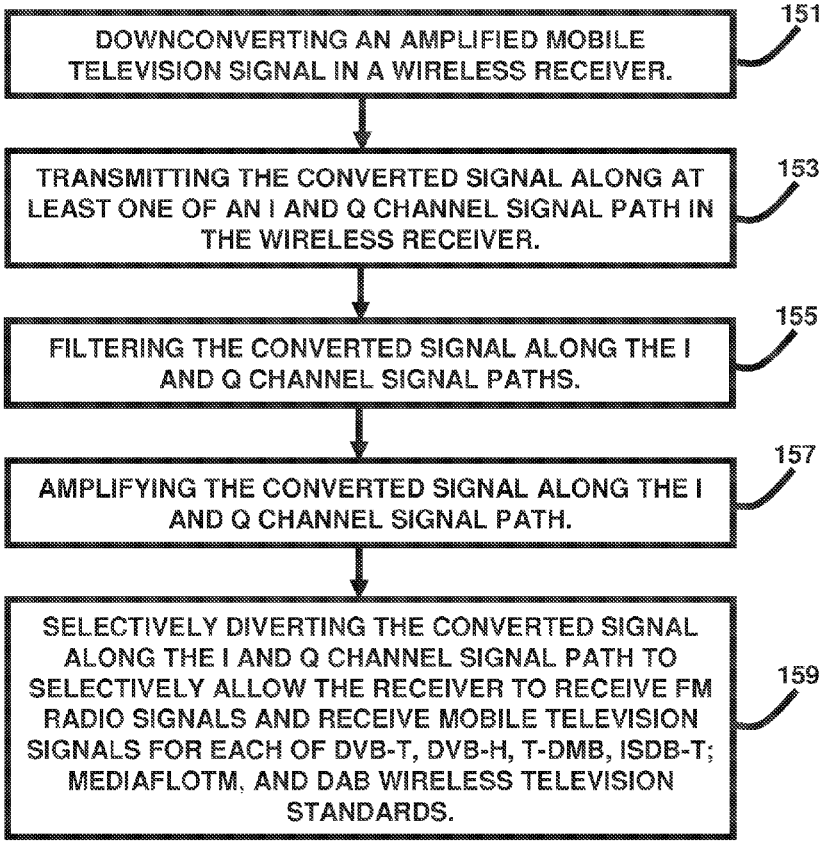
FIG. 6 is a flow diagram illustrating a preferred method according to an embodiment herein.

FIG. 6, with respect to FIGS. 1 through 5, is a flow diagram illustrating a method of receiving a television signal in a mobile television device according to an embodiment herein, wherein the method comprises downconverting (151) an amplified mobile television signal in a wireless receiver 100; transmitting (153) the converted signal along at least one of an I and Q channel signal path in the wireless receiver 100; filtering (155) the converted signal along the I and Q channel signal paths; amplifying (157) the converted signal along the I and Q channel signal path; and selectively diverting (159) the converted signal along the I and Q channel signal path to selectively allow the receiver 100 to receive FM radio signals and receive mobile television signals for each of DVB-T, DVB-H, T-DMB, ISDB-T; MediaFLO™, and DAB wireless television standards.

The embodiments herein can take the form of an entirely hardware embodiment, an entirely software embodiment or an embodiment including both hardware and software elements. The embodiments implemented in software include, but is not limited to firmware, resident software, microcode, etc. Furthermore, the embodiments herein can take the form of a computer program product accessible from a computer-usable or computer-readable medium providing program code for use by or in connection with a computer or any instruction execution system. For the purposes of this description, a computer-usable or computer readable medium can be any apparatus that can comprise, store, communicate, propagate, or transport the program for use by or in connection with the instruction execution system, apparatus, or device.

The medium can be an electronic, magnetic, optical, electromagnetic, infrared, or semiconductor system (or apparatus or device) or a propagation medium. Examples of a computer-readable medium include a semiconductor or solid state memory, magnetic tape, a removable computer diskette, a random access memory (RAM), a read-only memory (ROM), a rigid magnetic disk and an optical disk. Current examples of optical disks include compact disk-read only memory (CD-ROM), compact disk-read/write (CD-R/W) and DVD.

A data processing system suitable for storing and/or executing program code will include at least one processor coupled directly or indirectly to memory elements through a system bus. The memory elements can include local memory employed during actual execution of the program code, bulk storage, and cache memories which provide temporary storage of at least some program code in order to reduce the number of times code must be retrieved from bulk storage during execution.

Input/output (I/O) devices (including but not limited to keyboards, displays, pointing devices, etc.) can be coupled to the system either directly or through intervening I/O controllers. Network adapters may also be coupled to the system to enable the data processing system to become coupled to other data processing systems or remote printers or storage devices through intervening private or public networks. Modems, cable modem and Ethernet cards are just a few of the currently available types of network adapters.

The embodiments herein provide an integrated wireless tuner that can be embedded on an integrated circuit chip and that can be programmed to receive any mobile TV signal in various bands and in various mobile TV standards. The tuner utilizes programmable blocks that can be re-used and re-programmed in different configurations to optimize the performance for different standards. Block-re-use offers the advantage of reduced die area and cost. The tuner architecture can be configured as a low-IF receiver or a Direct Conversion Receiver (DCR) depending on the received signal characteristics. In the DCR embodiment, the receiver 100 includes AC coupling capacitors (not shown) between various stages that can be bypassed accordingly. Those skilled in the art would readily understand how such capacitors could be configured in the receiver 100. The DCR mode is suitable for wider bandwidth and there are no image rejection requirements. Moreover, the receiver 100 is implemented for the ATSC mobile TV standard in the DCR mode. The low-IF mode is suitable for low bandwidth signals, and this mode does not suffer from flicker noise and DC offset problems. Moreover, the tuner 100 provides programmable filtering and gain control to suit the need of each mobile-TV standard.

The foregoing description of the specific embodiments will so fully reveal the general nature of the embodiments herein that others can, by applying current knowledge, readily modify and/or adapt for various applications such specific embodiments without departing from the generic concept, and, therefore, such adaptations and modifications should and are intended to be comprehended within the meaning and range of equivalents of the disclosed embodiments. It is to be understood that the phraseology or terminology employed herein is for the purpose of description and not of limitation. Therefore, while the embodiments herein have been described in terms of preferred embodiments, those skilled in the art will recognize that the embodiments herein can be practiced with modification within the spirit and scope of the appended claims.

What is claimed is:

1. A tuner for use in [mobile television] *communication* devices, said tuner comprising:

at least one radio frequency (RF) front end component comprising:

a low noise amplifier (LNA) adapted to amplify [mobile television] *communication* signals;

a phase-locked loop (PLL) circuit adapted to generate signals; and a pair of mixers adapted to receive the signals from said LNA and said PLL circuit and downconvert the received signals;

an analog baseband component operatively connected to said RF front end component, wherein said analog baseband component comprises an I channel signal path and a Q channel signal path, and wherein each of the I and Q channel signal paths comprise:

a tunable high order impedance filter;

at least one signal amplification stage; and a signal filter stage operatively connected to said at least one signal amplification stage, wherein said analog baseband component further comprises a plurality of switches operatively connected to said I and Q channel signal paths, and wherein said plurality of switches are selectively opened and closed in multiple configurations in order to allow said tuner to receive [mobile TV] *communication* signals [for all mobile TV standards].

2. The tuner of claim 1, further comprising a polyphase filter operatively connected to said I and Q channel signal paths.

3. The tuner of claim 2, wherein said plurality of switches comprises a switch configured between one of said at least one signal amplification stage of said I channel signal path and said polyphase filter.

4. The tuner of claim 3, wherein said switch is configured prior to said polyphase filter along said I channel signal path.

5. The tuner of claim 3, wherein said switch is configured after to said polyphase filter along said I channel signal path.

6. The tuner of claim 2, wherein said plurality of switches comprises a switch configured between one of said at least one signal amplifications stage of said Q channel signal path and said polyphase filter.

7. The tuner of claim 2, wherein said plurality of switches comprises a switch configured between two signal amplifications stages along each of said I and Q channel signal paths.

8. The tuner of claim 2, wherein said plurality of switches comprises a switch configured between one of said at least one signal amplification stage and said signal filter stage along each of said I and Q channel signal paths.

9. The tuner of claim 1, wherein said tunable high order impedance filter comprises a complex tunable high order impedance filter.

10. The tuner of claim 2, wherein said plurality of switches comprise:

a first switch configured between one of said at least one signal amplification stage of said I channel signal path and said polyphase filter, wherein said first switch is configured prior to said polyphase filter;

a second switch configured between one of said at least one signal amplification stage of said Q channel signal path and said polyphase filter, wherein said second switch is configured prior to said polyphase filter;

a third switch configured after said polyphase filter and prior to any of a second one of said at least one signal amplification stage of said I channel signal path and said signal filter stage of said I channel signal path;

a fourth switch configured between said one of said at least one signal amplification stage along said I channel signal path and any of a second one of said at least one signal amplification stage of said I channel signal path and said signal filter stage of said I channel signal path; and a fifth switch configured between said one of said at least one signal amplification stage along said Q channel signal path and any of a second one of said at least one signal amplification stage of said I channel signal path and said signal filter stage of said Q channel signal path.

11. The tuner of claim 10, wherein when the first, second, third, fourth, and fifth switches are opened, said tuner is adapted to [(i) receive Frequency Modulation (FM) radio signals, and (ii) receive mobile television signals for Digital Video Broadcast—Terrestrial (DVB-T), Digital Video Broadcast—Handheld (DVB-H), Terrestrial—Digital Multimedia Broadcast (T-DMB), Integrated Services Digital Broadcast—Terrestrial (ISDB-T); Media Forward Link Only (MediaFLO™), and Digital Audio Broadcast (DAB) wireless television standards] *receive communication signals*.

12. The tuner of claim 10, wherein when the first, second, and third switches are opened and the fourth and fifth switches are closed, said tuner is adapted to [(i) receive Frequency Modulation (FM) radio signals, and (ii) receive mobile television signals for Digital Video Broadcast—Terrestrial (DVB-T), Digital Video Broadcast—Handheld (DVB-H), and Media Forward Link Only (MediaFLO™) wireless television standards] *receive communication signals*.

13. The tuner of claim 10, wherein when the first, second, and third switches are closed and the fourth and fifth switches are opened, said tuner is adapted to receive [mobile television signals for Terrestrial—Digital Multimedia Broadcast (T-DMB), Integrated Services Digital Broadcast—Terrestrial (ISDB-T), and Digital Audio Broadcast (DAB) wireless television standards] *communication signals*.

14. The tuner of claim 11, wherein the opened switches enable said timer to operate in a direct conversion mode.

15. The tuner of claim 12, wherein the opened switches enable said tuner to operate in a direct conversion mode.

16. The tuner of claim 13, wherein the opened switches enable said tuner to operate in a low-IF heterodyne mode.

17. The tuner of claim 1, wherein said plurality of switches that are selectively opened cause circuit elements operatively connected to said opened switches and after the opened switches along said I and Q channel signal paths to refrain from consuming power.

18. The tuner of claim 1, further comprising at least one AC coupling capacitor configured along said I and Q channel signal paths.

19. A wireless receiver for use in [mobile television] *communication* devices, said wireless receiver comprising:

at least one radio frequency (RF) front end component comprising:

a low noise amplifier (LNA) adapted to amplify [mobile television] *communication* signals;

a phase-locked loop (PLL) circuit adapted to generate signals; and a pair of mixers adapted to receive the signals from said LNA and said PLL circuit and downconvert the received signals;

an analog baseband component operatively connected to said RF front end component, wherein said analog baseband component comprises:

an I channel signal path;

a Q channel signal path;

a polyphase filter operatively connected to the I and Q channel signal paths; and at least five switches operatively connected to said I and Q channel signal paths, wherein said at least five switches are selectively opened and closed in multiple configurations in order to allow said wireless receiver to receive [mobile TV] *communication* signals [for all mobile TV standards], and wherein said at least five switches that are selectively opened cause circuit elements operatively connected to said opened switches and after the opened switches along said I and Q channel signal paths to refrain from consuming power.

20. A method of receiving a [television] signal in a [mobile television] *communication* device, said method comprising:

amplifying a [mobile television] *communication* signal using a low noise amplifier (LNA) in at least one radio frequency (RF) front end component of said device;

generating signals using a phase-locked loop (PLL) circuit in said at least one RF front end component of said device;

downconverting the amplified [mobile television] *communication* signal from said LNA and said signals from said PLL in a pair of mixers in said at least one RF front end component of said device;

transmitting the converted signal along at least one of an I and Q channel signal path in an analog baseband component of said device, wherein each of the I and Q channel signal paths comprise:

a tunable high order impedance filter;

at least one signal amplification stage; and a signal filter stage operatively connected to said at least one signal amplification stage, filtering said converted signal along the I and Q channel signal paths;

amplifying said converted signal along said I and Q channel signal path; and selectively diverting said converted signal along said I and Q channel signal path by selectively opening and closing a plurality of switches in said analog baseband component to selectively allow said device to receive radio signals and mobile television signals for all mobile television standards.

*21. The tuner of claim 1, wherein said communication signals comprise mobile television communication signals.*

*22. The receiver of claim 19, wherein said communication signals comprise mobile television communication signals.*

*23. The method of claim 20, wherein said communication signals comprise mobile television communication signals.*

* * * * *